(12) United States Patent
Woods et al.

(10) Patent No.: US 8,124,870 B2
(45) Date of Patent: Feb. 28, 2012

(54) SYSTEMS AND PROCESSES FOR BIFACIAL COLLECTION AND TANDEM JUNCTIONS USING A THIN-FILM PHOTOVOLTAIC DEVICE

(75) Inventors: Lawrence M. Woods, Littleton, CO (US); Rosine M. Ribelin, Lakewood, CO (US)

(73) Assignee: ITN Energy System, Inc., Littleton, CO (US)

( * ) Notice: Subject to any disclaimer, the term of this patent is extended or adjusted under 35 U.S.C. 154(b) by 1127 days.

(21) Appl. No.: 11/858,010

(22) Filed: Sep. 19, 2007

(65) Prior Publication Data
US 2009/0308437 A1  Dec. 17, 2009

Related U.S. Application Data

(60) Provisional application No. 60/845,705, filed on Sep. 19, 2006.

(51) Int. Cl.
*H01L 31/00* (2006.01)
(52) U.S. Cl. .......................... 136/256; 136/260; 136/262
(58) Field of Classification Search .................. None
See application file for complete search history.

(56) References Cited

U.S. PATENT DOCUMENTS

| 3,419,593 A | 12/1968 | Willing et al. |
| 4,081,819 A | 3/1978 | Wong |
| 4,087,585 A | 5/1978 | Schulz |
| 4,260,780 A | 4/1981 | West |
| 4,276,424 A | 6/1981 | Peterson, Jr. et al. |
| 4,314,956 A | 2/1982 | Baney et al. |
| 4,324,901 A | 4/1982 | West |
| 4,335,266 A | 6/1982 | MicKelsen et al. |
| 4,510,094 A | 4/1985 | Drahnak |
| 4,530,879 A | 7/1985 | Drahnak |
| 4,542,257 A | 9/1985 | Fraser et al. |
| 4,663,495 A | 5/1987 | Berman et al. |
| 4,680,422 A * | 7/1987 | Stanbery ........................ 136/249 |
| 4,766,176 A | 8/1988 | Lee et al. |
| 4,816,324 A | 3/1989 | Berman |
| 5,017,654 A | 5/1991 | Togashi et al. |
| 5,028,274 A | 7/1991 | Basol et al. |
| 5,194,649 A | 3/1993 | Okawa |
| 5,441,897 A | 8/1995 | Noufi et al. |

(Continued)

FOREIGN PATENT DOCUMENTS

EP  0078541  5/1983

(Continued)

OTHER PUBLICATIONS

Noufi et al., Toward a 25% efficient polycrystalline thin-film tandem solar cell: practical issues, May 2003, 3rd World Conference on PV Energy Conversion, pp. 12-14.*

Nakada, T. et al. "Novel device structure for Cu(ln,Ga)Se2 thin film solar cells using transparent conducting oxide back and front contacts" Solar Energy vol. 77, No. 6, Dec. 2004, pp. 739-747.

(Continued)

*Primary Examiner* — Alexa Neckel
*Assistant Examiner* — Shannon Gardner
(74) *Attorney, Agent, or Firm* — Lathrop & Gage LLP

(57) ABSTRACT

A thin-film photovoltaic device includes a semi-transparent back contact layer. The semi-transparent back contact layer includes a semi-transparent contact layer and a semi-transparent contact interface layer. The thin-film photovoltaic device may be formed in a substrate or superstrate configuration. A tandem thin-film photovoltaic device includes a semi-transparent interconnect layer. The semi-transparent interconnect layer includes a semi-transparent contact layer and a semi-transparent contact interface layer.

7 Claims, 6 Drawing Sheets

U.S. PATENT DOCUMENTS

| | | | |
|---|---|---|---|
| 5,496,961 | A | 3/1996 | Dauth et al. |
| 5,909,632 | A | 6/1999 | Gessert |
| 5,990,413 | A | 11/1999 | Ortabasi |
| 6,537,845 | B1 | 3/2003 | McCandless et al. |
| 6,852,614 | B1 | 2/2005 | Compaan et al. |
| 7,037,592 | B2 | 5/2006 | Zhu et al. |
| 2005/0056312 | A1 | 3/2005 | Young et al. |
| 2005/0061437 | A1 | 3/2005 | Goto et al. |
| 2006/0240262 | A1 | 10/2006 | Zhu et al. |
| 2008/0115827 | A1 | 5/2008 | Woods |

FOREIGN PATENT DOCUMENTS

| | | |
|---|---|---|
| EP | 0881695 A2 | 12/1998 |
| EP | 1207188 A2 | 5/2002 |
| EP | 1388572 A1 | 2/2004 |
| EP | 1489666 A1 | 12/2004 |
| GB | 2085657 | 4/1982 |
| GB | 2405030 | 2/2005 |
| JP | 2181975 | 7/1990 |
| JP | 5218482 | 8/1993 |
| JP | 7263733 | 10/1995 |
| JP | 08078355 | 3/1996 |
| JP | 8181339 | 7/1996 |
| JP | 9132716 | 5/1997 |
| JP | 10321887 | 12/1998 |
| JP | 10321888 | 12/1998 |
| WO | WO 03022564 | 3/2003 |
| WO | WO 03043096 | 5/2003 |
| WO | WO 03105238 | 12/2003 |
| WO | WO2005/006451 A1 | 1/2005 |
| WO | WO2005/017058 A1 | 2/2005 |
| WO | WO2005/052078 A2 | 9/2005 |
| WO | WO2006/088645 A1 | 8/2006 |
| WO | WO2006/088646 A1 | 8/2006 |
| WO | WO2007/018283 A1 | 2/2007 |
| WO | WO2007/018756 A1 | 2/2007 |
| WO | WO2007/092032 A2 | 8/2007 |
| WO | WO2007/092118 A2 | 8/2007 |
| WO | WO2007/097835 A2 | 8/2007 |
| WO | WO2007/120905 A2 | 10/2007 |
| WO | WO2007/121006 A2 | 10/2007 |
| WO | WO2007/123898 A1 | 11/2007 |
| WO | WO2007/123901 A1 | 11/2007 |
| WO | WO2007/145885 A2 | 12/2007 |
| WO | WO/2008/013611 A1 | 1/2008 |

OTHER PUBLICATIONS

Herberholz, R., et al. Investigation of the chalcogen interdiffusion in CuIn(TeSe)2 thin films, Solar Energy Materials and Solar Cells, Elsevier, Amsterdam, 1996, vol. 44, No. 4, pp. 357-366.

Benchouk, K. et al. "New buffer layers, large band gap ternary compounds: CuAlTe2" EPJ. Applied physics, EDP Sciences, Les Ulis, France, vol. 10, No. 1, Apr. 2000, pp. 9-14.

Ali, A. et al. "Investigation of Cu-containing law resistivity CdTe thin films firm deposited by the two-source evaporation technique: Investigation of Cu-containing low ressistivity CdTe thin films" Semiconductor Science and Technology, IOP, Bristol, GB, vol. 21, No. 9, Sep. 1, 2006, pp. 1296-1302.

Bonnet, D. et al. "New Results on the Development of a Thin Film p-CdTe-n-CdS Heterojunction Solar Cell" Conf. Record IEEE Photovoltaic Specialists Conference, May 4, 1972, pp. 129-132.

Schorr et al., "Electronic band gap of Zn2x ( CuIn)1-x X2 solid solution series (X=S,Se,Te)" Journal of Alloys and Compounds 414, Apr. 2006, pp. 26-30.

Nakada, T. et al. "Cu(In$_1$ Ga$_x$)Se$_2$ -Based Thin Film Solar Cells Using Transparent Conducting Back Contacts" Jpn. J. Appl. Phys., vol. 41, (2002), pp. L1209-L1211.

NASA Tech Briefs, Semiconductors & ICs, May 2006, pp. 42 and 44.

PCT/US2007/078941 Invitation to Pay Additional Fees and Partial Search Report mailed May 7, 2008.

PCT/US2007/078941 International Search Report & Written Opinion mailed Jul. 15, 2008.

PCT/US2007/078941 Response to Written Opinion, Oct. 14, 2008, 7 pages.

PCTUS07066902 International Search Report & Written Opinion mailed May 26, 2008.

U.S. Appl. No. 60/955,245.

U.S. Appl. No. 60/902,806.

Assali et al. "Electrical Properties of CuAlTe2 Thin Films and Mo/CuAlTe2 Contact Prepared by RF Sputtering", 39 p. 33 (1995).

Benchouk et al. "Growth and Physiochemical Characterization of CuAlTe2 Films Obtained by Reaction, Induced by Annealing Between Cu/Al/Te/Al/Cu . . . A/Cu/AlTe Layers Sequentially Deposited", , J. of Mater. Sci., 34 p. 1847 (1999).

Birkmire, R. et al.; Analysis of a Transparent Cu/ITO Contact and Heat Treatments on CdTe/CdS Solar Cells, Proc. 19th IEEE PVSC (1987), p. 967.

Birkmire, R., Eser, E., Fields, S. & Shafarman,W., Cu(InGa)Se2 Solar Cells on a Flexible Polymer Web; Space Photovoltaic Research and Technology Conference at NASA Glenn in Cleveland, Ohio (Sep. 2005), pp. 191-194.

Diaz, et al. "Characterization of Cu-In-Se-Te System in Thin Films Grown by Thermal Evaporation", J. Vac. Sci. Technol. A, 10(2), p. 295 (1992).

Diaz, et al. Effect of the Composition and Anion Vacancies in the Band Gap and Band Levels of Cu-In-Se-Te Thin Films, J. Fac. Sci. Technol. A 13(6), p. 2803 (1995).

Guo, A., Fry, B.E. & Neckers, D.C., Highly Active Visible-Light Photocatalysts for Curing a Ceramic Precursor, *Chemistry of Materials*, vol. 10, No. 2 (Feb. 1998) pp. 531-536.

Kazmerksi et al. "Vacuum-Deposited CuInTe2 Thin Films", J. Vac. Sci. Technol., 14(3), p. 769 (1977).

Matulionis, I, Han, S., Drayton, J.A., Price, K.J. & Compaan, A.D., CdTe Solar Cells on Molybdenum Substrates Mat. Res. Soc. Symp. Proc. 668, H8.23.1 (2001).

Meyers, P. et al.; Polycrystalline CdTe on CuInSe2 Cascaded Solar Cells; Proc. 20th IEEE PVSC (1988), p. 1448].

Nadenua et al., "Growth of CuInTe2 Polycrystalline Thin Films", J. of Cryst. Growth, 146 p. 251 (1995).

Reese, H., Development of Silicone Substrates to Be Used With CIGS Deposition, Final Report, Feb. 1, 2005, Contract F49620-03-C-0047, pp. 1-59.

SBIR/STTR Proposal #: 021NM-1056 Phase I, Abstract, retrieved from http://www.sbirsttrmall.com/award/AwardDetails.aspx?pk=7394 Feb. 6, 2006; 2 pages.

SBIR/STTR Proposal #: 021NM-1056 Phase II, Abstract, retrieved from http://www.sbirsttrmall.com/award/AwardDetails.aspx?pk=8955 Feb. 6, 2006; 2 pages (Apr. 2003).

Virshup et al. "23.9% Monolithic Multi-Junction Solar Cell", Proc. 20th IEEE PVSC (1988) p. 441.

Zhang et al. "A Phenomenological Model for Systematization and Prediction of Doping Limits in II-VI and I-III-VI2 Compounds", J. App. Phys., 86(6), p. 3192 (1999).

Toro, C., Ph.D, "Metal Contacts to CuInSe2", Disseration, Brown University, May 1987; pp. 1-86.

Woods et al., "Exploration of CIGAS Alloy System for Thin-Film Photovoltaics on Novel Lightweight and Flexible Substrates"; presented at the Space Photovoltaic Research and Technology Conference on Sep. 20, 2005; 9 pages.

Woods et al., "Exploration of the CuInAlSe2 (CIGAS) Alloy System for Thin-Film Photovoltaics on Novel Lightweight and Flexible Substrates"; presented at the Space Photovoltaic Research and Technology Conference on Sep. 20, 2005; 23 pages.

Woods et al., "Wide Bandgap CIAS Solar Cells Deposited on a Moving Substrate and the Development of a Transparent Back Contact"; disclosed at the Space Photovoltaic Research and Technology Conference on Sep. 17, 2003; 8 pages.

Woods et al., "Components Toward Next Generation Two-Terminal Tandem Photovoltaics Using Thin-Film CIS Based Alloys"; submitted to the International Energy Conversion Engineering Conference on Jun. 15, 2003; 5 pages.

International Search Report, PCT/US2007/009359, mailed Sep. 10, 2007.

International Search Report, PCT/US2007/009365, mailed Sep. 10, 2007.

\* cited by examiner

US 8,124,870 B2

SYSTEMS AND PROCESSES FOR BIFACIAL COLLECTION AND TANDEM JUNCTIONS USING A THIN-FILM PHOTOVOLTAIC DEVICE

CROSS-REFERENCE TO RELATED APPLICATIONS

This application claims benefit of priority to U.S. Provisional Patent Application Ser. No. 60/845,705 filed 19 Sep. 2006, which is incorporated herein by reference.

U.S. GOVERNMENT RIGHTS

This invention was made with Government support under National Aeronautics and Space Administration Grant No. NNC05CA41C. The Government has certain rights in this invention.

BACKGROUND

Photovoltaic ("PV") devices generally consist of one or more active photovoltaic materials capable of generating an electric potential upon exposure to light, and electrical contacts constructed on a suitable substrate that are used to draw off electric current resulting from irradiation of the active PV material. PV devices are generally rigid, either because the active PV material itself is rigid, or because the substrate or other components of the device are inflexible. For example, glass, which is relatively inflexible, is frequently used as a substrate in thin film photovoltaic ("TFPV") devices because of its strength, durability, tolerance to high processing temperatures and desirable optical properties.

TFPV devices are commonly distinguished from their thicker single-crystal PV counterparts in their ability to absorb light in relatively thin layers, and their ability to function well when fabricated using low-cost deposition techniques, and upon a variety of low-cost, lightweight and flexible substrates. Thus, TFPV devices are being considered for a variety of applications where weight and flexibility are important, such as for space satellites and high-altitude airships.

TFPV devices commonly include a solar absorber layer formed of a Group II-VI material, a Group I-III-VI.sub.2 material, or a Group III-V material. However, a solar absorber layer can be formed of other materials. The term Group II-VI material refers to a compound having a photovoltaic effect that is formed from at least one element from each of groups II and VI of the periodic table. In the context of this disclosure, Group II elements include Zinc, Cadmium, Mercury, and Magnesium and Group VI elements include Sulfur, Selenium, and Tellurium. The term Group I-III-VI.sub.2 material refers to a compound having a photovoltaic effect that is formed of at least one element from each of groups I, III, and VI of the periodic table, where there are two atoms of the group VI element for every one atom of the group I and III elements. In the context of this disclosure, Group I elements include Copper, Silver, and Gold, and Group III elements include Boron, Aluminum, Gallium, Indium, and Thallium. The term Group III-V material refers to a compound having a photovoltaic effect that is formed from at least one element from each of groups III and V of the periodic table. In the context of this disclosure, Group V elements include Nitrogen, Phosphorous, Arsenic, Antimony, and Bismuth.

Prior art TFPV devices with flexible substrates typically use metal foil or polyimide substrates. Metal foil substrates are capable of withstanding the high-temperatures and harsh thin-film deposition conditions needed for the highest efficiency TFPV devices, however, they are relatively heavy and are opaque. The latter characteristic does not allow for bifacial or backside visible light collection from reflected light sources, such as albedo light from either the moon or earth. Nor does this characteristic allow for transmission of undesirable infra-red ("IR") light through the TFPV device; unused and untransmitted sub-bandgap light increases the operating temperature of the TFPV device and thereby decreases its efficiency. In one example, increased TFPV device operating temperature decreases efficiency by as much as 20%. Finally, opaque substrates do not allow for devices fabricated in the superstrate configuration, where the highest intensity visible light first passes through the substrate. Polyimide substrates are semi-transparent to IR light, however, they are only partially transparent to visible light or capable of withstanding the highest temperature thin-film deposition conditions required for certain CuInGaSe$_2$ ("CIGS") based devices. Thus polyimide substrates are not suitable for use in superstrate type and bifacial TFPV devices either.

Attempts to provide PV devices on flexible and semi-transparent substrates are disclosed in U.S. Pat. No. 4,816,324, where tetrafluoroethylene-perfluoroalkoxy resin is used as a substrate for the PV device. However, tetrafluoroethylene-perfluoroalkoxy resin cannot withstand processing temperatures higher than 200-250° C., and therefore cannot be used for fabrication of high-efficiency TFPV devices that utilize Group II-VI and Group I-III-VI.sub.2 light-absorber materials, such as Cadmium Telluride (CdTe) and Copper Indium Gallium Di-Selenide (CIGS), respectively, since these materials require significantly higher processing temperatures.

Another example of a substrate that is lightweight, flexible, and that comprises materials such as silicon or silicone resin that are semi-transparent to visible light is described in U.S. Provisional Patent Application Ser. No. 60/792,852, and U.S. Non-Provisional patent application Ser. No. 11/737,119, each of which are incorporated herein by reference. This particular substrate is capable of withstanding processing temperatures up to 600° C., thereby enabling use of high-efficiency CIGS and CdTe materials in fabricating TFPV devices. However, to enable bifacial light collection, both the top and bottom contacts to the TFPV device must be at least semi-transparent to visible light.

To increase efficiency of TFPV devices through bifacial collection, semi-transparent substrates and/or semi-transparent back contacts are needed. For example, a semi-transparent back contact using a thin metal film (e.g., Cu) followed by a transparent conducting oxide (TCO) (e.g., Indium Tin Oxide) has been used with CdTe thin film Group II-VI semiconductor materials grown in a superstrate configuration on heavy, rigid glass substrates, as disclosed in a paper titled "Analysis of a Transparent Cu/ITO Contact and Heat Treatments on CdTe/CdS Solar Cells" by R. Birkmire, S. Hegedus, B. McCandless, J. Phillips and W. Shafarman [Proc. 19$^{th}$ IEEE PVSC (1987), p 967]. However, a thin Cu layer would be difficult to implement with thin-film devices grown in a substrate configuration, because the back contact layer is deposited first and may be damaged and diffuse into other layers during the subsequent processing required for the solar absorber material. Application of the solar absorber material typically includes high heat, vacuum, and use of reactive elements such as Se or S. Thus, transparent back contact materials utilized for superstrate configuration cannot necessarily be used for substrate configuration.

Semi-transparent back contact grids have been used along with a highly doped back semiconductor in Group II-VI solar cells materials (e.g., CdTe, ZnTe) in the superstrate configuration on heavy, rigid glass substrates for mechanically stacked four-terminal tandem TFPVs, as disclosed in a paper titled "Polycrystalline CdTe on CuInSe$_2$ Cascaded Solar Cells," by P. Meyers, C. Liu, L. Russell, V. Ramanathan, R. Birkmire, B. McCandless and J. Phillips [Proc. 20$^{th}$ IEEE PVSC (1988), p1448].

Solar absorbing layers of typical CIGS TFPV devices are p-type and with back contacts formed by intimate connection to thick, opaque metals such as Mo, Ni, or Au that form a low resistance Schottky barrier contact. Thus, these typical high-performance back contacts do not enable visible light to pass through.

It has not been possible to fabricate TFPV devices with semi-transparent back contacts and acceptable performance where the TFPV device is based upon high-bandgap (greater than 1.4 eV) Group I-III-VI.sub.2 materials. For example, when standard semi-transparent TCOs are used without an interface layer as the back contact for wide-bandgap CuInGaSe$_2$ (CIGS) solar absorbing material, low efficiency (e.g., less than 4% efficient) devices result. However, the same back contact layer used with low-bandgap (less than 1.2 eV) CIGS solar absorbing material produces high-efficiency devices (e.g., greater than 10% efficient). Thus, transparent back contact materials utilized for low-bandgap solar absorber materials cannot necessarily be used for wide-bandgap solar absorber materials, as needed for a transparent interconnect in monolithic two-terminal tandem devices.

Monolithic two-terminal tandem devices in the substrate configuration based on crystalline III-V materials and amorphous/microcrystalline Si have been fabricated and commercially sold. In the case of the crystalline III-V bottom cell, the tandem device is fabricated at temperatures greater than 700° C. using expensive deposition equipment for controlled crystal growth that is not amenable to very large area depositions. Thus this technology cannot be reasonably applied to relatively inexpensive large-area depositions using polycrystalline thin-films on low cost and/or flexible substrates. Furthermore, the transparent back contact design concepts of crystalline and amorphous/microcrystalline silicon devices such as tunnel junction interconnects cannot be readily transferred to devices based on polycrystalline CIS and related alloys. Such difficulty in transferring design concepts is due to difficulty in achieving tightly controlled spatial positioning required by tunnel junctions through doping and diffusion of impurities when in the presence of grain boundaries, which act as conduits for diffusion. In addition, very high levels of doping are difficult to achieve in CIS based alloy materials without also creating compensating defects. Thus, other device designs/structures may be preferred.

SUMMARY

A thin-film photovoltaic device includes a semi-transparent substrate for supporting the thin-film photovoltaic device. A semi-transparent back contact layer is disposed on the semi-transparent substrate. The semi-transparent back contact layer includes a semi-transparent contact layer disposed on the semi-transparent substrate, and a semi-transparent contact interface layer including a Cu(X)Te$_2$ material disposed on the semi-transparent contact layer. X is at least one of In, Ga, and Al. A solar absorber layer is disposed on the semi-transparent back contact layer, and the solar absorber layer includes one of a Group I-III-VI.sub.2 material and a Group II-VI material. A heterojunction partner layer disposed on the solar absorber layer, and a top contact layer is disposed on the heterojunction partner layer.

A thin-film photovoltaic device includes a semi-transparent substrate for supporting the thin-film photovoltaic device and a top contact layer disposed on the semi-transparent substrate. A heterojunction partner layer is disposed on the top contact layer, and a solar absorber layer is disposed on the heterojunction partner layer. The solar absorber layer includes one of a Group I-III-VI.sub.2 material and a Group II-VI material. A semi-transparent back contact layer is disposed on the solar absorber layer. The semi-transparent back contact layer includes a semi-transparent contact interface layer including a Cu(X)Te$_2$ material disposed on the solar absorber layer and a semi-transparent contact layer disposed on the semi-transparent contact interface layer. X is at least one of In, Ga, and Al.

A tandem thin-film photovoltaic device includes a substrate for supporting the device. A back contact layer is disposed on the substrate, and a bottom solar absorber layer is disposed on the back contact layer. A bottom heterojunction partner layer is disposed on the bottom solar absorber layer. A semi-transparent interconnect layer includes a semi-transparent contact layer disposed on the bottom heterojunction partner layer and a semi-transparent contact interface layer disposed on the semi-transparent contact layer. The semi-transparent contact interface layer includes a Cu(X)Te$_2$ material, where X is at least one of In, Ga, and Al. A top solar absorber layer is disposed on the semi-transparent interconnect layer, where the top solar absorber layer includes one of a Group I-III-VI.sub.2 material and a Group II-VI material. A top heterojunction partner layer is disposed on the top solar absorber layer, and a top contact layer is disposed on the top heterojunction partner layer.

A thin-film photovoltaic device includes a substrate for supporting the device. The substrate includes at least one of silicone, reinforced silicone, reinforced silicone resin, and silicone coated metal foil. A semi-transparent back contact layer is disposed on the substrate. The semi-transparent back contact layer includes a semi-transparent contact layer disposed on the substrate and a semi-transparent contact interface layer disposed on the semi-transparent contact layer. A solar absorber layer is disposed on the semi-transparent back contact layer, and a heterojunction partner layer is disposed on the solar absorber layer. A top contact layer is disposed on the heterojunction partner layer.

A thin-film photovoltaic device includes a semi-transparent silicone substrate for supporting the device. A top contact layer is disposed on the semi-transparent silicone substrate, and a heterojunction partner layer is disposed on the top contact layer. A solar absorber layer is disposed on the heterojunction partner layer, and a semi-transparent back contact layer is disposed on the solar absorber layer. The semi-transparent back contact layer includes a semi-transparent contact interface layer disposed on the solar absorber layer and a semi-transparent contact layer disposed on the semi-transparent contact interface layer.

DETAILED DESCRIPTION

Figure 1:
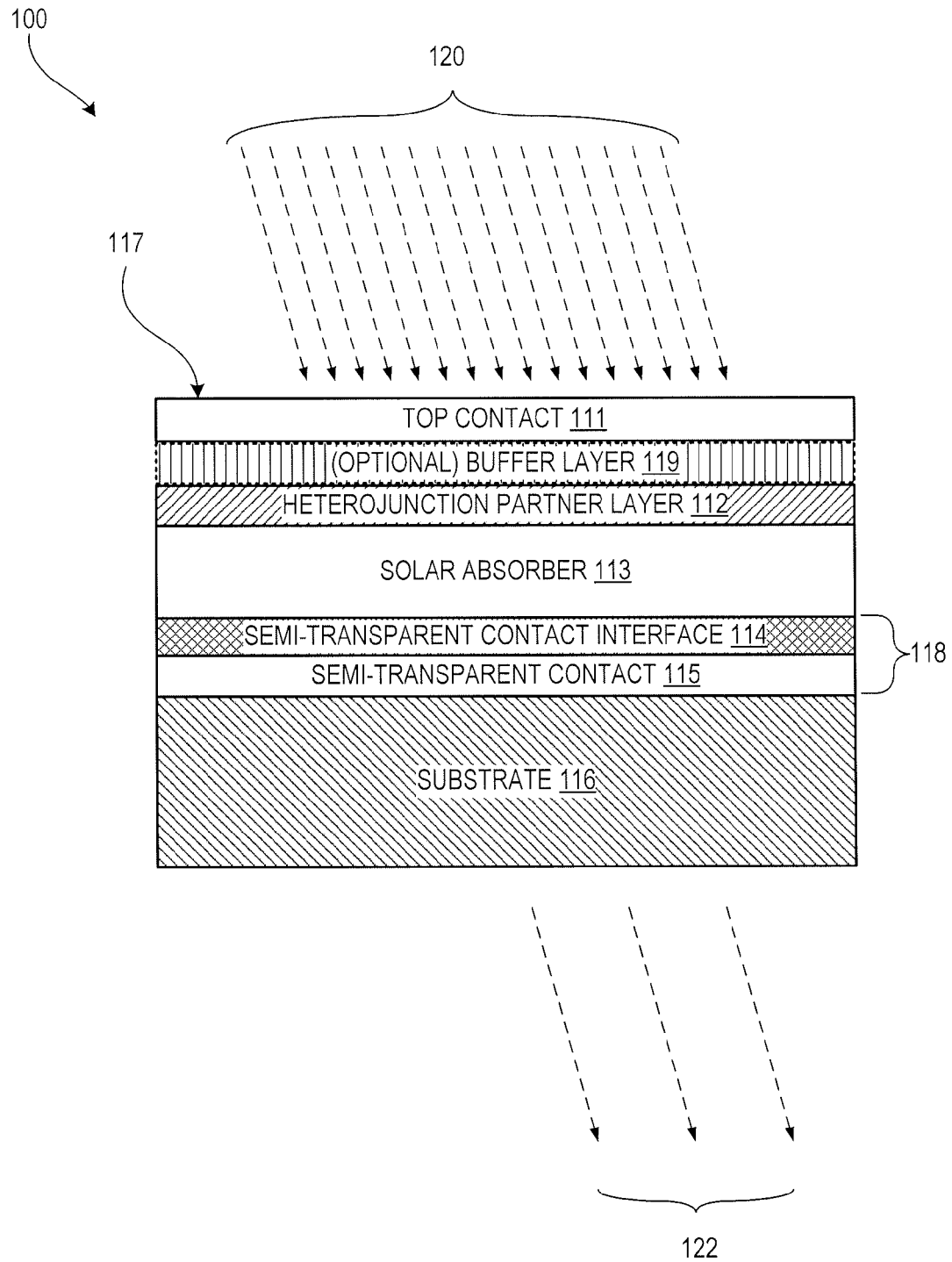
FIG. 1 shows a cross-sectional schematic view of a structure forming one TFPV device in substrate configuration, in accordance with an embodiment.

The present disclosure may be understood by reference to the following detailed description taken in conjunction with the drawings briefly described below. It is noted that, for purposes of illustrative clarity, certain elements in the drawings may not be drawn to scale.

TFPV solar cells based upon Group I-VI and Group I-III-VI.sub.2 light-absorbing materials may provide low cost photovoltaic technology and may be deposited on lightweight and flexible substrates for high efficiency (W/m$^2$) and specific power (W/Kg) characteristics. A semi-transparent back contact with a high-temperature, lightweight and flexible semi-transparent substrate may enable higher efficiency TFPV devices, as compared to prior art devices, due to bifacial collection (e.g., above bandgap transmission into the device) and infrared (IR) light transmission out of the device (e.g., sub-bandgap).

A process is thus disclosed for forming a relatively low resistance semi-transparent back contact between p-type Group I-III-VI.sub.2 or Group II-VI solar absorbers and a Transparent Conducting Oxide (TCO), which can transmit sub-bandgap light and/or enable bifacial operation. This leads to a low cost, power efficient tandem TFPV device using a semi-transparent back contact formed by the process. Furthermore, a low cost, power efficient single junction TFPV device for bifacial operation may be produced using the semi-transparent back contact in conjunction with a semi-transparent, lightweight, and flexible substrate. Other features and advantages will become apparent in the following detailed description.

FIG. 1 shows a cross-sectional schematic view of a TFPV device 100 that is fabricated with Group I-III-VI.sub.2 (e.g., CuInGaSe$_2$), Group II-VI (e.g, CdSe), or Group III-V (e.g., GaAs) solar absorber materials 113 and a semi-transparent back contact 118, which is semi-transparent to at least infrared light. TFPV device 100 also has a substrate 116, a heterojunction partner layer 112 (sometimes referred to as a window layer), an optional buffer layer 119 and a top contact 111. Back contact 118 is shown with two layers: a semi-transparent contact interface 114; and a semi-transparent contact 115. Semi-transparent contact interface 114 and semi-transparent contact 115 are at least partially transparent to infrared light. In embodiments, semi-transparent contact interface 114 and semi-transparent contact 115 are also semi-transparent to visible light. However, semi-transparent contact interface 114 may be omitted for low bandgap Group I-III-VI.sub.2 solar absorber based bifacial devices where a high temperature and flexible substrate is used. Optional buffer layer 119 may, for example, represent an optional 'buffer' layer of insulating ZnO employed in many CIGS devices.

As shown, TFPV device 100 is formed in a substrate configuration with substrate 116 located below semi-transparent back contact 118 (relative to the direction of primary light incidence 120 upon a top surface 117 of TFPV device 100). However, a superstrate configuration may be provided for optically transparent substrates, by instead locating substrate 116 above top contact 111, relative to the direction of primary light incidence 120, in accord with another embodiment and without departing from the scope hereof. Substrate 116 may be rigid or flexible. Substrate 116 may, for example, be formed of at least one of glass, silicone, silicone resin, reinforced silicone, reinforced silicone resin, and high temperature polyimide.

Semi-transparent back contact layer 118 and substrate 116 may transmit sub-bandgap light 122 away from TFPV device 100 when the substrate is semi-transparent to sub-bandgap light, thereby reducing the operating temperature of TFPV device 100. Semi-transparent back contact layer 118 and substrate 116 may also transmit above-bandgap light into the TFPV device 100, thereby enabling bifacial light collection or absorption. Both of these mechanisms can increase the device operating efficiency (W/m$^2$), power output (W/kg), and output voltage (Voltage/cell).

Figure 2:
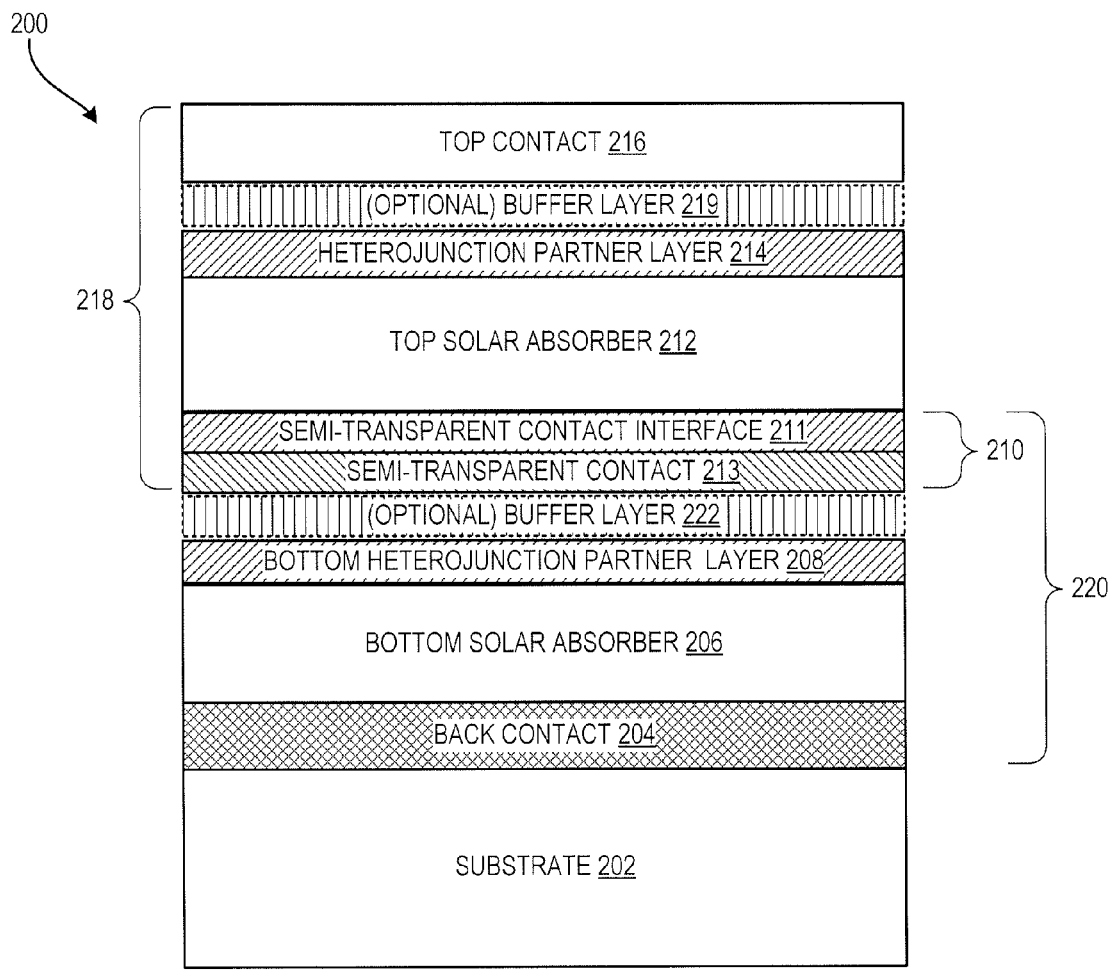
FIG. 2 shows a cross-sectional schematic view of one monolithic tandem TFPV device, in accordance with an embodiment.

Layers 111, 112, 113, 114 and 115 of TFPV device 100 may be used as a top cell of a tandem device (e.g., tandem device 200, FIG. 2).

The electro-optical properties of CuInTe$_2$ and CuAlTe$_2$ have been considered for use in TFPV devices. More specifically, the electron affinity of CuInTe$_2$ is about 0.5 eV less than CuInSe$_2$ (CIS), but the bandgap of the telluride remains about the same as the selenide. Under certain circumstances, and considering theoretical band energies, this indicates that the band-edge discontinuity between the valence band of the telluride and the work function level of traditional opaque Mo back contacts may be 0.5 eV less than that of discontinuity of the selenide and traditional opaque Mo back contacts, which may result in lower contact resistance (lower Schottky barrier height) for the telluride compared to the selenide. Moreover, the telluride has the potential for being p-type and degenerately doped than selenide, which would also aid in the formation of a low resistance contact. This reasoning was then applied to the wider bandgap alloys with aluminum or CuAlSe$_2$ and CuAlTe$_2$. As a semi-transparent back contact interface layer 114, CuAlTe$_2$ has good optical transparency in the wavelength region of interest since as it has a bandgap of 2.06 eV. The higher valence band-edge energy of the telluride may be responsible for the good contact with Mo and may also be helpful in forming contacts to TCOs.

Semi-transparent back contact 118 may, for example, be fabricated by depositing semi-contact interface 114 onto semi-transparent contact 115. Semi-transparent contact interface 114 may, for example, be a wide-bandgap alloy of Cu(X)(Te)$_2$ where X=In, Ga, or Al, or any combination of these three elements that results in a lower resistance between semi-transparent contact 115 and solar absorber 113. Such semi-transparent contact interface formed of a wide-bandgap alloy of Cu(X)(Te)$_2$ is sometimes referred to as a CIGAT contact interface. Ideally, the bandgap of the Cu(X)(Te)$_2$ semi-transparent contact interface 114 would also be selected to be much higher than the bandgap of the solar absorber 113 to maximize the transparency of above-bandgap light to the solar absorber during bifacial operation. Alternatively, the semi-transparent contact interface layer 114 may be a thin (less than 100 Å, for example) metal layer (e.g., Mo) that is semi-transparent due to the low thickness or incomplete coverage, and relatively inert to the solar absorber deposition process. Semi-transparent contact interface 114 may provide low absorption of light due to its low thickness and/or incomplete coverage and/or its wide-bandgap characteristic. Semi-transparent contact 115 may, for example, be conductive electrodes consisting of TCOs such as ZnO:Al, Indium Tin Oxide (ITO), or $SnO_2$, or a similarly transparent conducting material such as Stannates, or transparent layers with carbon nanotubes. This process of forming a low resistance and semi-transparent back contact 118 to Group I-III-VI.sub.2 materials (e.g., solar absorber 113) for use in TFPV devices (e.g., TFPV device 100) allows sub-bandgap light to be transmitted through semi-transparent back contact 118, while also enabling bifacial operation of TFPV device 100. Other semi-transparent back contact interface layers 114 such as thin Cu, or Cu doped ZnTe, which are detailed in published papers or patents, may be appropriate for CdTe based solar absorbers 113.

In one example of fabrication of TFPV device 100, a semi-transparent current carrying transparent contact 115 is deposited onto substrate 116 by means of sputtering, chemical vapor deposition, evaporation, or other thin-film deposition technique. Semi-transparent contact interface 114, which may be formed of $CuAlTe_2$, may be likewise be deposited onto semi-transparent contact 115 by means of sputtering, chemical vapor deposition, evaporation, or other thin-film deposition techniques.

A Group I-III-VI.sub.2 p-type material (e.g., solar absorber 113) may be deposited onto semi-transparent back contact 118 with an optional n-type semiconductor surface layer. Solar absorber 113 may optionally have a near surface region that is n-type. Deposition of solar absorber 113 may, for example, be achieved by means of co-evaporation, thermal evaporation, spraying, printing, or other thin-film deposition techniques and may contain selenides, sulfides, and tellurides of Cu, Ag, Al, Ga, In, Tl, and their alloys. In one example, solar absorber 113 may be a variation of $Cu(In,Ga,Al)(Se,S)_2$ such as CIGS.

A heterojunction partner layer 112 may be deposited by chemical bath deposition (CBD), chemical vapor deposition, sputtering, or other known techniques. Heterojunction partner layer 112 is, for example, CdS, ZnS, (Cd, Zn)S, ZnSe, ZnO, or $SnO_2$.

Buffer Layer 119, if included, may, for example, be deposited by chemical bath deposition (CBD), chemical vapor deposition, sputtering, or other technique.

Top contact layer 111 may be deposited onto heterojunction partner layer 112 or buffer layer 119 and may be mostly transparent to the solar spectrum. In one example, top contact layer 111 is a TCO (e.g., ITO or doped ZnO). A semi-transparent current carrying transparent contact 111 is deposited onto the buffer or heterojunction partner layer by means of sputtering, chemical vapor deposition or other thin-film deposition technique.

FIG. 2 shows a cross-sectional schematic view of a monolithic tandem device 200 having a top cell 218 containing a wide-bandgap solar absorber layer 212 and a bottom cell 220 containing a low-bandgap solar absorber 206 that are joined by a semi-transparent interconnect layer 210. Top cell 218 is, for example, similar to TFPV device 100 in FIG. 1. Since top cell 218 may transmit sub-bandgap light, bottom cell 220 may be designed and fabricated to absorb and convert this light to electricity. Tandem device 200 may, for example, be based on thin-film high-efficiency and low cost CIS and related alloys that provide a higher efficiency ($W/m^2$), specific power (W/kg), and Voltage (Voltage/cell) than do existing single-junction CIGS devices. In addition, tandem device 200 may also have a lower cost per unit power output. In one embodiment, tandem device 200 is flexible (e.g., by using flexible material layers and substrate). In another embodiment, tandem device 200 is rigid (e.g., glass substrate or other rigid substrate).

Tandem device 200 is shown with a substrate 202, a back contact 204, a bottom solar absorber 206, a bottom heterojunction partner layer 208 (sometimes referred to as a window layer), an optional buffer layer 222, a semi-transparent contact 213, a semi-transparent contact interface 211, a top solar absorber 212, a top heterojunction partner layer 214, an optional buffer layer 219, and a top contact 216. Tandem device 200 may, for example, utilize high-efficiency, low cost, and easy to manufacture Group I-III-VI.sub.2 solar absorber materials, due to the ability for bandgap engineering. An efficient wide-bandgap top solar absorber 212 is desirable for top cell 218 as it is beneficial to the performance of good tandem devices. Top cell 218 is formed upon semi-transparent interconnect 210 (i.e., semi-transparent interconnect 210 functions as a back contact for top cell 218). Semi-transparent interconnect 210 may, for example, be similar to back contact 118 of FIG. 1, and is shown with a semi-transparent contact interface 211 and a semi-transparent contact 213. Top contact 216, top heterojunction partner layer 214, top solar absorber 212, and semi-transparent interconnect 210 form top cell 218. TFPV device 100 of FIG. 1 may be used (without substrate 116) as the top cell 218 of tandem device 200.

Top cell 218 of tandem device 200 may be capable of transmitting unused above-bandgap light and sub-bandgap light to bottom cell 220. Since absorption of light that is not converted to electricity may increase the operating temperature of top cell 218, as it may with any single-junction device, allowing unused light to be transmitted to bottom cell 220 may increase the efficiency of top cell 218.

Figure 3:
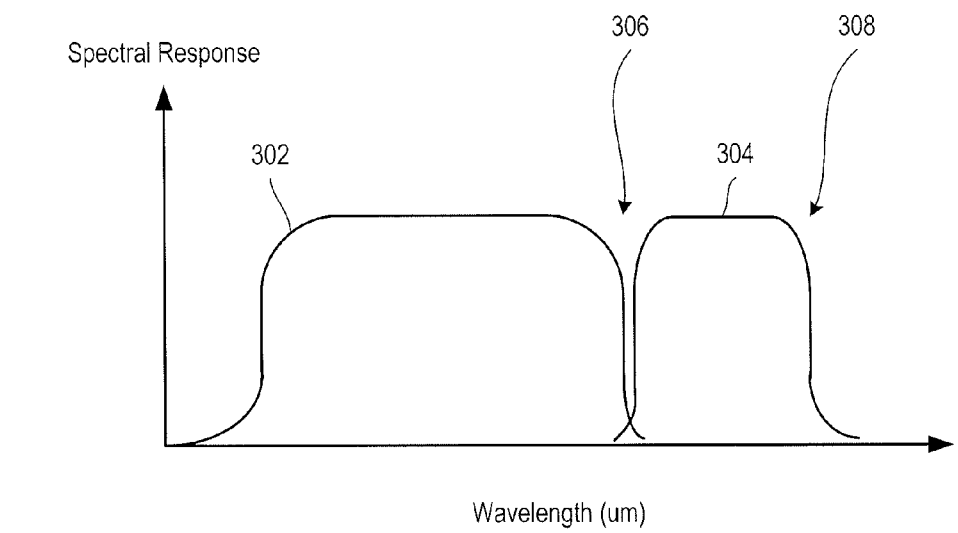
FIG. 3 shows a typical schematic spectral response of the TFPV device of FIG. 2.

FIG. 3 shows an illustration of an idealized spectral response graph 300 of TFPV device 200 of FIG. 2. A top cell spectral response curve 302 of top cell 218 has a spectral edge 306. A bottom cell spectral response curve 304 of bottom cell 220 has a spectral edge 308. Top cell spectral response 302 has a wide-bandgap, represented by spectral edge 306, and bottom cell spectral response 304 has a smaller bandgap, represented by spectral edge 308 and at a higher light wavelength than the wide-bandgap spectral edge.

Figure 4:
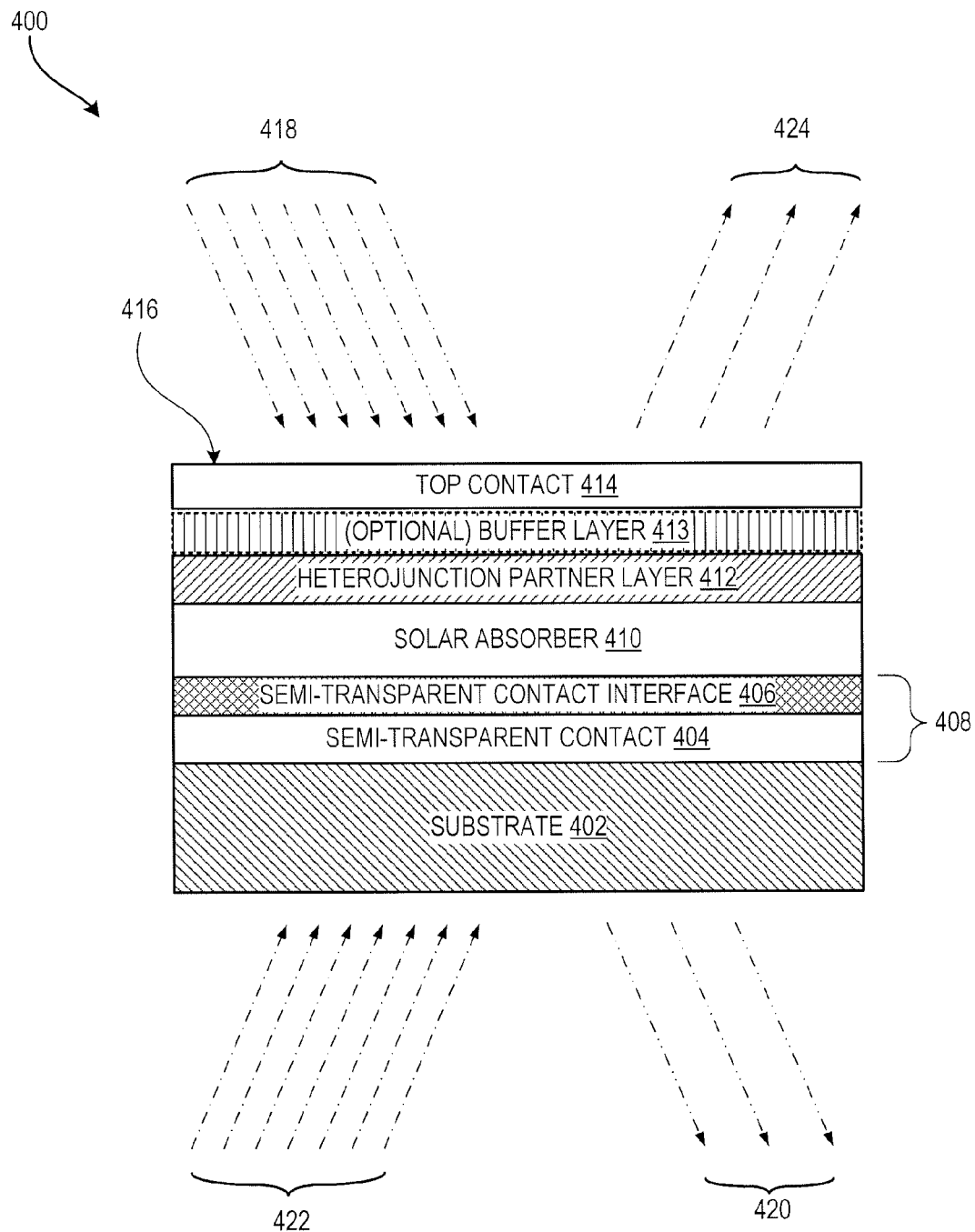
FIG. 4 shows a cross-sectional schematic view of a structure forming one single junction flexible TFPV device capable of bifacial light collection, in accordance with an embodiment.

FIG. 4 shows a cross-sectional schematic view of a structure forming one exemplary embodiment of single junction flexible TFPV device 400 that is capable of bifacial light collection. TFPV device 400 is fabricated upon a semi-transparent substrate 402 and has a semi-transparent back contact 408 (which may, for example, be formed of a semi-transparent contact 404 and a semi-transparent contact interface 406 as shown), a solar absorber 410 (e.g., Group I-III-VI.sub.2, Group II-VI, Group III-V), a heterojunction partner layer 412 (sometimes referred to as a window layer), an optional buffer layer 413, and a top contact 414. Since semi-transparent back contact 408 components of TFPV device 400 are semi-transparent to visible and infrared light, bifacial light collection is possible, and heating that results from absorbing unused light is lowered.

The use of semi-transparent back contact 408 (also referred to herein as "transparent back contact 408" or "back contact 408") and IR transparent substrate 402 may reduce the operating temperature of TFPV device 400. The reduction in operating temperature may increase the operating efficiency (e.g., $W/m^2$), specific power output (W/kg), and output voltage (Voltage/cell) of TFPV device 400. In addition, semi-transparent back contact 408 may enable bifacial operation of TFPV device 400 when substrate 402 is selected to be semi-transparent to above-bandgap light. In certain space or high altitude applications, bifacial operation may increase the output of TFPV device 400 by as much as 30%.

In FIG. 4, TFPV device 400 is shown in substrate configuration. However, layers 404, 406, 410, 412 and 414 may also be fabricated in a superstrate configuration without departing from the scope hereof.

Substrate 402 may be lightweight, flexible, and be formed of semi-transparent materials. For example, substrate 402 may comprise silicone or silicone resin. Substrate 402 may be reinforced, if necessary, as described in U.S. Provisional Patent Application Ser. No. 60/792,852 and in U.S. Non-Provisional patent application Ser. No. 11/737,119. Substrate 402 may be capable of withstanding processing temperatures up to 600° C. thereby enabling use of high-efficiency CIGS and CdTe materials in fabricating TFPV device 400.

Semi-transparent contact 404 may be a semi-transparent current carrying TCO such as ZnO:Al, ITO, and $SnO_2$, or a similarly transparent conducting materials such as Stannates or transparent layers with carbon nanotubes. Semi-transparent contact interface 406 may be a thin semi-transparent layer that is applied to semi-transparent contact 404 to lower resistance between solar absorber 410 and semi-transparent contact 404. Semi-transparent contact 404 may be deposited by means of sputtering, chemical vapor deposition, or other thin-film deposition techniques.

In one embodiment, semi-transparent contact interface 406 is a discontinuous layer of metal, and/or is a very thin semi-transparent layer of metal, for use with $CuInGaAlSe_2$ (CIGAS) based solar absorbing material. In another embodiment, semi-transparent contact interface 406 is a wide-bandgap semiconductor fabricated from $Cu(In,Ga,Al)(Te)_2$ for use with CIGS based solar absorbers or from ZnTe for use with CdTe based solar absorbers. Semi-transparent contact interface 406 may, for example, be deposited by means of sputtering, chemical vapor deposition, co-evaporation, or other thin-film deposition techniques.

Solar absorber 410 may be a p-type semiconductor layer with an optional n-type semiconductor surface layer formed from the copper, or group I, deficient phase of the solar absorber. Deposition of solar absorber 410 may be by means of co-evaporation or other thin-film deposition techniques.

Heterojunction partner layer 412 may be deposited by chemical bath deposition (CBD) or other deposition techniques. The technique employed, however, should not damage the surface of solar absorber 410. Heterojunction partner layer 412 may, for example, be an n-type semiconductor fabricated from either CdS, (Cd, Zn)S, ZnO, ZnOH, or ZnSe.

A top contact layer 414 makes contact with n-type heterojunction partner layer 412 and may be mostly transparent to the solar spectrum. In one embodiment, top contact layer 414 is a transparent ITO or ZnO:Al. Optionally, buffer layer 413 may be included between top contact layer 414 and heterojunction partner layer 412. Buffer layer 413 may be a layer of insulating ZnO as found in many CIGS devices.

TFPV device 400 may be further fabricated using monolithic interconnection or by other means.

In one example of operation, incident light 418 (e.g., visible solar light or white light) primarily enters the top 416 of TFPV device 400 and passes through top contact layer 414. Light 418 is then partially absorbed by heterojunction partner layer 412 and p-type solar absorber 410. In particular, above-bandgap light is mostly absorbed by p-type solar absorber 410 and sub-bandgap light is mostly transmitted through solar absorber 410, semi-transparent back contact 408, and semi-transparent substrate 402, and away from TFPV device 400 (shown as sub-bandgap light 420). Similarly, light 422 (e.g., reflected solar or white light) incident on the back of TFPV device 400 enters through semi-transparent substrate 402 and semi-transparent back contact 408, and above-bandgap light is then absorbed by solar absorber 410 and heterojunction partner layer 412. Below bandgap light 424 (i.e., unused light) is then mostly transmitted out through top contact 414, and away from TFPV device 400.

Figure 5:
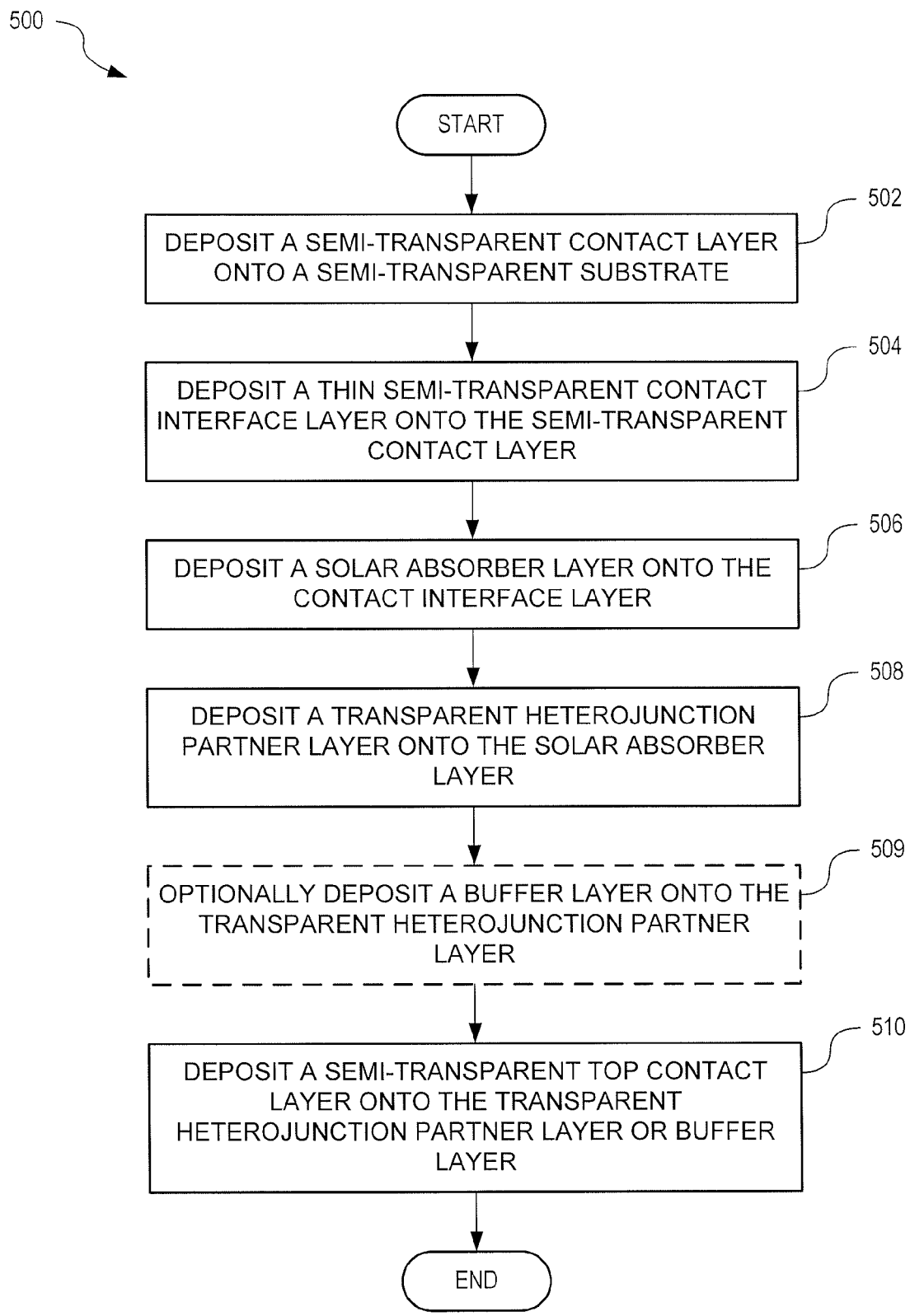
FIG. 5 shows a flowchart illustrating one process for fabricating a TFPV device in substrate configuration, in accordance with an embodiment.

FIG. 5 is a flowchart illustrating one example of a process 500 of fabricating a bifacial TFPV device (e.g., TFPV device 400, FIG. 4). A semi-transparent contact layer is deposited, in step 502, onto a semi-transparent substrate. In one example of step 502, semi-transparent contact layer 404 is ITO and is deposited onto semi-transparent substrate 402 made of silicone resin. A thin semi-transparent contact interface layer is deposited, in step 504, onto the semi-transparent contact layer deposited in step 502. In one example of step 504, a semi-transparent contact interface layer 406 is a 1,000 Angstrom thick layer of $CuAlTe_2$, with a Cu/Al ratio of 1, and is deposited onto semi-transparent contact layer 404, which is ITO. A solar absorber layer is deposited, in step 506, onto the semi-transparent contact interface layer deposited in step 504. In one example of step 506, solar absorber layer 410 is $CuInGaAlSe_2$, and is deposited onto semi-transparent contact interface layer 406, which is $CuAlTe_2$.

In step 508, a transparent heterojunction partner layer is deposited onto the solar absorber layer deposited in step 506. In one example of step 508, heterojunction partner layer 412, is CdZnS and is deposited onto solar absorber layer 410, which is $CuInGaAlSe_2$. Step 509 is optional. In step 509, a buffer layer is deposited onto the transparent heterojunction partner layer of step 508. In one example of step 509, buffer layer 413 is ZnO, and is deposited onto heterojunction partner layer 412, which is CdZnS. A semi-transparent top contact layer is deposited, in step 510, onto the transparent heterojunction partner layer of step 508 (or the buffer layer of step 509, if included). In one example of step 510, top contact layer 414 is ITO and is deposited onto heterojunction partner layer 412, which is CdZnS.

Figure 6:
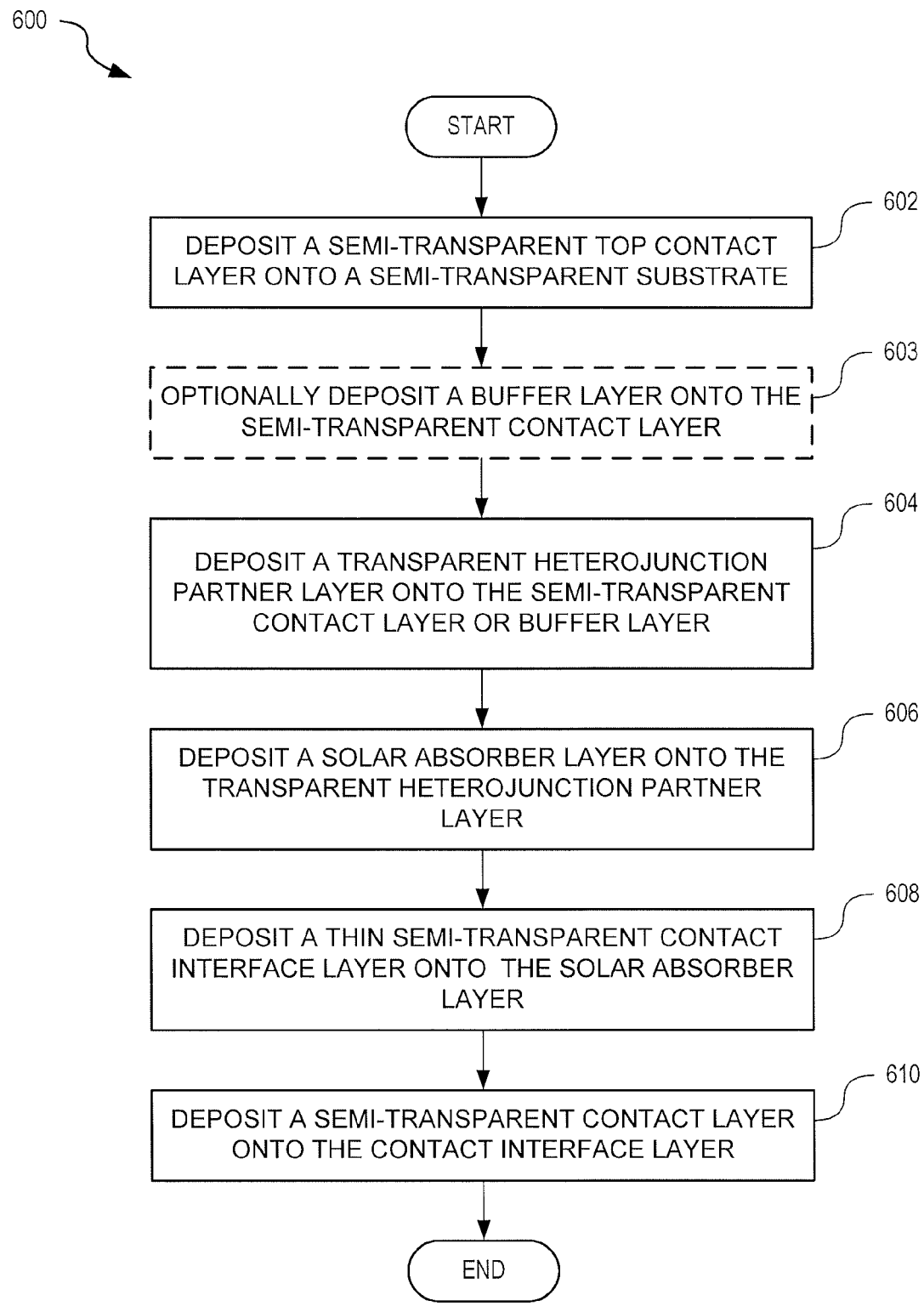
FIG. 6 shows a flowchart illustrating one process for fabricating a TFPV device in superstrate configuration, in accordance with an embodiment.
Figure 7:
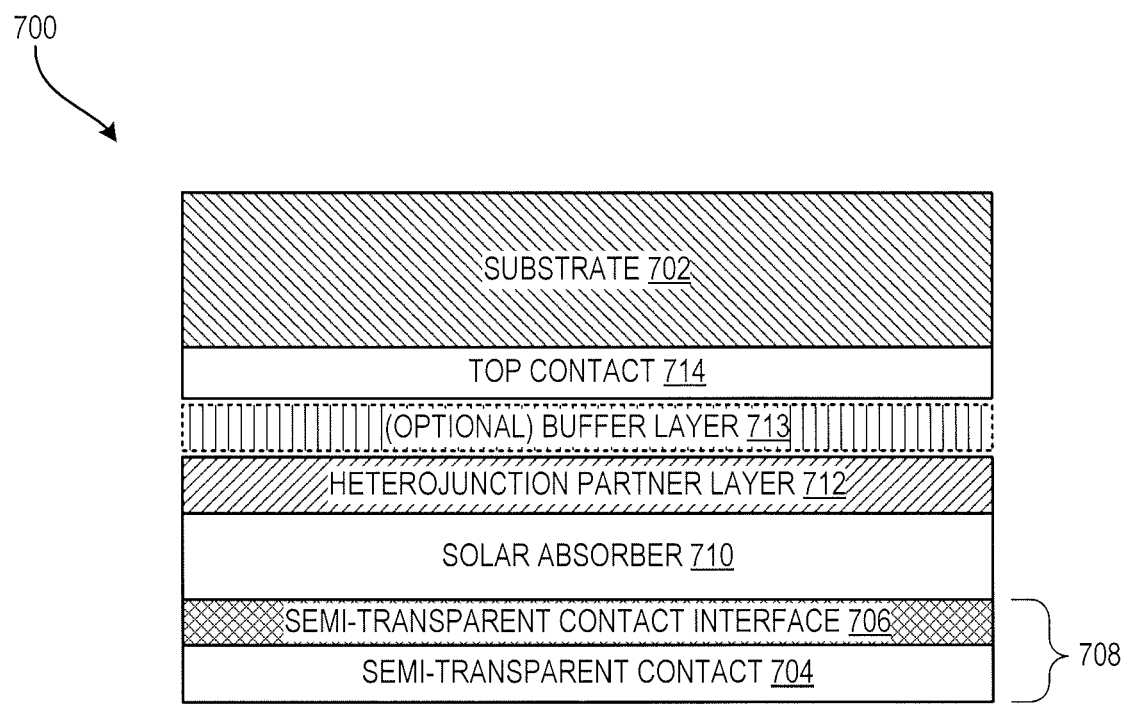
FIG. 7 shows a cross-sectional schematic view of materials forming one TFPV device in superstrate configuration, in accordance with an embodiment.

FIG. 6 shows a flowchart illustrating one process 600 for fabricating a TFPV device in superstrate configuration. FIG. 7 shows a cross-sectional schematic view of materials forming one example of a TFPV device 700 in superstrate configuration. FIGS. 6 and 7 are best viewed together with the following description.

In step 602, a semi-transparent top contact layer 714 is deposited onto a semi-transparent substrate layer 702. In one example of step 602, top contact layer 714 is a TCO, such as ITO, that is sputtered onto substrate 702, which is made of silicone resin. Step 603 is optional. In step 603, a buffer layer is deposited onto the semi-transparent contact layer of step 602. In one example of step 603, buffer layer 713 is ZnO, and is deposited onto top contact layer 714, such as ITO. In step 604, a transparent heterojunction partner layer 712 (sometimes referred to as a window layer) is deposited onto top contact layer 714 of step 602 or onto the buffer layer of step 603. In one example of step 604, heterojunction partner layer 712 is ZnO that is deposited onto top contact layer 714, such as ITO, using a chemical bath deposition technique.

In step 606, a solar absorber layer 710 is deposited onto heterojunction partner layer 712. In one example of step 606, solar absorber layer 710 is made of a Group I-III-VI.sub.2 p-type material, such as CIGS, which is deposited using a thermal evaporation technique onto heterojunction partner layer 712. In another example of step 606, a Group II-VI or a Group III-V material, such as CdSe, is deposited onto heterojunction partner layer 712. In step 608, a thin semi-transparent contact interface layer 706 is deposited onto solar absorber layer 710. In one example of step 608, a wide-bandgap telluride based Group I-III-VI.sub.2 p-type material, such as CuInGaAlTe$_2$, is deposited onto solar absorber layer 710 using a sputtering technique. In step 610, a semi-transparent contact layer 704 is deposited onto semi-transparent contact interface layer 706. In one example of step 610, a TCO, such as ITO, is deposited onto contact interface layer 706 using a sputter deposition technique. Layers 704 and 706 are illustratively shown together as back contact layer 708 in FIG. 7.

As appreciated, the CIGAT semi-transparent contact interface layer disclosed above may be used to improve contact to wide-bandgap solar absorbers in PV devices that have non-transparent back contacts without departing from the scope hereof. For example, such devices may have a CIGAT semi-transparent contact interface layer adjacent to a wide-bandgap solar absorber and have a thick opaque metal (e.g., Mo) adjacent to the CIGAT contact interface layer. Thus, TCO may not be needed as the back contact if bifacial operation is not required. The CIGAT semi-transparent contact interface layer may also be used with an opaque substrate (e.g., a silicone coated metal foil substrate) in embodiments of substrate configuration TFPV devices.

As appreciated, superstrate PV devices may use silicone or silicone resin (reinforced or not) as the substrate and may have non-transparent back contacts, without departing from the scope hereof.

EXPERIMENTAL RESULTS

Bifacial light collection testing was performed on TFPV device 100 or 400 to determine if bifacial light collection occurs. AM1.5 light (100 mW/cm$^2$) from a solar simulator was incident on top of each device, while a halogen lamp light source, also calibrated to 100 mW/cm$^2$, was directed towards the substrate side of each device. Tests performed upon a CuInGaAlSe$_2$ (CIGAS) device with bandgap in the range 1.3 to 1.4 eV and fabricated on a glass substrate (substrate configuration) and using a semi-transparent back contact consisting of approximately 40 angstrom thick molybedum contact interface layer on an ITO contact layer, showed that an additional 25% power may be achieved through bifacial operation (due to a 14% increase in current and an improved fill factor) of the device. Transparency measurements of semi-transparent back contact 408 on a glass substrate show a 40-60% transparency to visible light, indicating that there are additional reflectance losses and current collection losses within the device since only 25% increase in power output is observed. Nonetheless, during operation in space, if about 30% of the space solar intensity were available to the back of the CIGAS device (e.g., via albedo light), then an increase in output power of over 8% (i.e., 30% of 25%) may be expected from this prototype device. Bifacial light collection testing of a CIGAS device fabricated upon a lightweight and flexible silicone substrate, however, indicated only a slight increase in performance. It was determined that only a small fraction of light was passing through back contact 408 and substrate 402, possibly due to the thin metallic contact interface layer being too thick on the device tested. Thickness of semi-transparent contact interface 406 may have a large effect on light transmission through back contact 408. Nonetheless, enhanced performance with bifacial collection was demonstrated.

A comparison of non-bifacial device performance (Efficiency and Open-circuit voltage) was performed on devices using lightweight and flexible silicone substrates and devices with similar composition on glass substrates for both opaque Mo back contacts and semi-transparent back contacts (bifacial capable) made from a very thin Mo contact interface layer followed by an ITO transparent contact. The device was in the substrate configuration and the solar absorber was low-bandgap CIGS. The non-bifacial testing results showed that the devices on the lightweight and flexible silicone substrates are capable of performing as well as devices on thick glass substrates, and likely even better than thick glass substrates if comparing just the results with semi-transparent back contacts. Device efficiencies over 11% were demonstrated with the traditional opaque Mo back contacts. Thus, lightweight and flexible substrates are compatible with the devices described herein and do not limit the CIGAS deposition temperature which leads to higher performance devices.

In another comparison of non-bifacial device performance in the substrate configuration, two semi-transparent contact interface layers were compared: a thin Mo layer, and a thin CuAlTe$_2$ layer. The solar absorbers were high-bandgap CIGAS with [Ga+Al]/III ratios in the 54 to 62 range, typically corresponding to bandgaps in the range of about 1.55-1.65 eV. The semi-transparent contact layer for these devices of this comparison was florine-doped SnO$_2$, which together with the semi-transparent contact interface layer and glass substrate, make these devices capable of bifacial collection. The 1.16 cm$^2$ devices were illuminated from the top (through the top contact) with AM1.5 light (100 mW/cm$^2$) from a solar simulator and current-voltage measurements were performed. Three devices of each type were compared and the devices with the CuAlTe$_2$ interface layers were identified as 70816-1A-C3, 70822-1E-E3, and 70822-2A-C5. The devices with the thin Mo interface layers were identified as 70816-1E-E3, 70822-1A-C3, and 70822-2E-E3. The photovoltaic device series resistance in the range of 2 to 2.5 volts was used as the measure of back contact electrical performance, as in this voltage range other device effects are minimized. The series resistance for the device with the CuAlTe$_2$ interface layer was found to be 26.3, 5.8, and 19.2 ohm-cm$^2$ for an average of 17.1 ohm-cm$^2$. The series resistance for the device with the thin Mo interface layer was found to be 6.1, 35.7, and 25.0 ohm-cm$^2$ for an average of 22.3 ohm-cm$^2$. These values are typical for the high-bandgap solar absorbers. As discussed above, the thin Mo contact interface layers in combination with the TCO contact layer have already shown comparable performance to thick opaque Mo layers when using high-bandgap solar absorbers. However the usable thin Mo contact interface layers have also shown to have limited visible light transmission, in the range of 60-70%, prior to the CIGAS deposition. Given that the CuAlTe$_2$ is a thin high-bandgap semiconductor, then the absorption loss through this layer is negligible compared to the solar absorber itself.

Changes may be made in the above systems and processes without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present process and system, which, as a matter of language, might be said to fall there between.

What is claimed is:
1. A tandem thin-film photovoltaic device, comprising:
a substrate;
a back contact layer disposed on the substrate;
a bottom solar absorber layer disposed on the back contact layer;
a bottom heterojunction partner layer disposed on the bottom solar absorber layer;

a semi-transparent interconnect layer, including:
    a semi-transparent contact layer disposed on the bottom heterojunction partner layer, and
    a semi-transparent contact interface layer including a $Cu(X)Te_2$ material disposed on the semi-transparent contact layer, wherein X is at least one of In, Ga, and Al;
a top solar absorber layer disposed on the semi-transparent interconnect layer, the top solar absorber layer including one of a Group I-III-VI.sub.2 material and a Group II-VI material;
a top heterojunction partner layer disposed on the top solar absorber layer; and
a semi-transparent top contact layer disposed on the top heterojunction partner layer.

2. The tandem thin-film photovoltaic device of claim 1, the semi-transparent interconnect layer comprising a plurality of contacts.

3. The tandem thin-film photovoltaic device of claim 1, the substrate comprising at least one of silicone resin, silicone, reinforced silicone, reinforced silicone resin, high temperature polyimide, metal foil, insulated metal foil, and glass.

4. The tandem thin-film photovoltaic device of claim 1, the semi-transparent contact layer comprising at least one of a transparent conductive oxide, a stannate, and a transparent layer with carbon nanotubes.

5. The tandem thin-film photovoltaic device of claim 1, the top solar absorber layer comprising at least one of a surface and a near surface region that is n-type.

6. The tandem thin-film photovoltaic device of claim 1, further comprising a buffer layer disposed between the top heterojunction partner layer and the semi-transparent top contact layer.

7. The tandem thin-film photovoltaic device of claim 1, further comprising a buffer layer disposed between the bottom heterojunction partner layer and the semi-transparent interconnect layer.

* * * * *

UNITED STATES PATENT AND TRADEMARK OFFICE
CERTIFICATE OF CORRECTION

PATENT NO. : 8,124,870 B2
APPLICATION NO. : 11/858010
DATED : February 28, 2012
INVENTOR(S) : Woods et al.

It is certified that error appears in the above-identified patent and that said Letters Patent is hereby corrected as shown below:

Column 2, Line 26, "200-250 °C.," should read --200-250 °C,--;
Column 5, Line 22, "Group I-VI" should read --Group II-VI--;
Column 9, Line 14, "600 °C." should read --600 °C--;

Signed and Sealed this
Twenty-ninth Day of May, 2012

David J. Kappos
*Director of the United States Patent and Trademark Office*